(12) United States Patent
Hamm-Dubischar (10) Patent No.: US 7,738,691 B2
(45) Date of Patent: Jun. 15, 2010

(54) METHOD OF DETERMINING STRUCTURAL PROTOTYPE DATA FOR A LIGHT WEIGHT TECHNICAL STRUCTURE

(75) Inventor: Christian Hamm-Dubischar, Bremerhaven (DE)

(73) Assignee: Stiftung Alfred-Wegener-Institut Fuer Polar-und Meeresforschung, Bremerhaven (DE)

( * ) Notice: Subject to any disclaimer, the term of this patent is extended or adjusted under 35 U.S.C. 154(b) by 1058 days.

(21) Appl. No.: 10/580,301

(22) PCT Filed: Oct. 9, 2004

(86) PCT No.: PCT/EP2004/011483

§ 371 (c)(1),
(2), (4) Date: May 23, 2006

(87) PCT Pub. No.: WO2005/052818

PCT Pub. Date: Jun. 9, 2005

(65) Prior Publication Data

US 2007/0112522 A1 May 17, 2007

(30) Foreign Application Priority Data

Nov. 30, 2003 (DE) .............................. 103 56 682

(51) Int. Cl.
*G06F 19/00* (2006.01)
*G06F 17/50* (2006.01)
*G01N 33/48* (2006.01)

(52) U.S. Cl. ........................... 382/141; 700/182; 703/1; 702/19

(58) Field of Classification Search ................. 382/141, 382/100; 403/169, 170, 171; 264/255, 239, 264/241, 250; 333/208, 24 R, 202; 301/54, 301/58, 37.29, 104; 702/19; 703/1; 700/182
See application file for complete search history.

(56) References Cited

U.S. PATENT DOCUMENTS

| 4,180,293 A * | 12/1979 | Norris et al. .................. 301/54 |
| 4,385,785 A * | 5/1983 | Norris et al. ............. 301/37.29 |
| 2007/0030573 A1* | 2/2007 | Batchko et al. ............. 359/665 |

FOREIGN PATENT DOCUMENTS

DE 100 53 299 A1 5/2002

OTHER PUBLICATIONS

Nachtigall, W.: Vorbild Natur—Bionik Design fuer funktionelles Gestalten; Springer Verlag, 1997.
Mattheck, Claus: Design in der Natur—Der Baum als Lehrmeister; Rombach Oekologie, 1997.
Hamm et al.: Architecture and material properties of diatom shells provide effective mechanical protection; Nature, vol. 421, pp. 841-843; Feb. 2003.

(Continued)

Primary Examiner—Sheela C Chawan
(74) Attorney, Agent, or Firm—Leydig, Voit & Mayer, Ltd.

(57) ABSTRACT

A method of determining structural data of a prototype for a lightweight technical structure by selecting shell architectures of natural bio-mineralized unicellular organisms in accordance with an aspect set very closely adapted to the lightweight structure to be produced and by directly copying and thereafter scaling their structural data to the prototype before optimizing the Prototype by perfect adaptation to the lightweight structure to be produced.

12 Claims, 7 Drawing Sheets

OTHER PUBLICATIONS

Wunderschoene Kieselalgen: Muster fuer stabile Konstructionen; Alfred-Wegener-Institut fuer Polar- und Meeresforschung, Bremerhaven, Germany (http://www.awi-bremerhaven.de/AWI/Presse/PM/030219 diatomeen-d.html).

Jugendstil im Meer—Warum Kieselalgen so stabil und vielfaeltig sind; Forschungszentrum Juelich; (http://fz-juelich.dee/portal/index.php?Jahr=2003&index=281&cmd=show&mid=125).

Ralf Meske et al. "Topologie- und Gestaltungsoptimierung mit CAOSS und ABAQUS" [Online], Nov. 29, 2000, XP002328332, Abaqus Anwendertreffen 2000, Winterthur, URL: <http://www.fe-design.de/fileadmin/publicationen/publikationen2000/2000-09-29_ABAQUS_Anwendertreffen_Paper.pdf>.

J. Parkinson et al. "Beyond micromachining: the potential of diatoms" Trends in Biotechnology, Elsevier, Amsterdam, NL, vol. 17, No. 5, May 1999, pp. 190-196, XP004181356.

International Search Report for PCT/EP2004/011483, mailed on Oct. 25, 2005.

* cited by examiner

Fig. 1

Prior Art

Fig.2

Prior Art

Fig.3

Prior Art

Prior Art

Fig.8

Prior Art

Fig.9

Prior Art

METHOD OF DETERMINING STRUCTURAL PROTOTYPE DATA FOR A LIGHT WEIGHT TECHNICAL STRUCTURE

CROSS REFERENCE TO PRIOR APPLICATIONS

This application is a U.S. National Phase application under 35 U.S.C. §371 of International Application No. PCT/EP2004/011483, filed on Oct. 9, 2004, and claims benefit to German Patent Application No. DE 103 56 682.1, filed on Nov. 30, 2003. The International Application was published in German on Jun. 9, 2005 as WO 2005/052818 under PCT Article 21 (2).

BACKGROUND OF THE INVENTION

1. Field of the Invention

The present invention relates to a method of determining structural data of prototypes for a lightweight technical structure, to the practicing of the method of producing prototypes and to a prototype produced by the method.

2. The Prior Art

The use of models from nature for technical applications has been known for a long time and comes naturally human inclinations. During the course of evolution, nature has by natural selection created extremely energy-efficient structures and processes in response to the quest for the best strategy in the permanent struggle of the species for survival. These structures, even though for different reasons, seem also suitable and desirable for many technical applications. However, the conversion often fails because of the difficulty in directly applying the biological system to the desired technical system. The basis of such a conversion has to be, on the one hand, an exact study of the morphological structure of biological systems including the natural materials and their characteristics and, on the other hand, an intimate knowledge about their purpose, i.e. the overall connection of the observed system in its natural environment. Only such a comprehensive understanding from a biological-technical point of view enables a designer to structure technical systems on the basis of biologically effective mechanisms. The science of the systematic technical conversion of biological structures and processes into the technical field is generally referred to as bionics or biomimetics.

Many publications deal with interpreting such principles and with the presentation of the current state of the art. Publication I (Werner Nachtigall, "Vorbild Natur—Bionik-Design fuer funktionelles Gestalten", Springer Verlag, 1997) describes the basic principles of natural structures [I, p. 21 seq.]: Nature does not construct additive components maximized to individual main characteristics, but it develops integrated systems optimized in respect of the sum of its requisite characteristics. In nature, the system of energy to be acquired by food intake is confronted by the energetic effort of defense/fleeing on the one hand and of reproduction on the other hand. The more effectively energy can be applied, the greater is the chance of survival. Light yet sturdy structures and detailed adaptions to the most variegated environmental conditions are the result and represent a vast pool of designs which can be utilized by technology. The lotus effect may serve as the best known example of bionic design [I, pages 43-44]. In connection therewith it was possible to demonstrate that surfaces, e.g. those of leaves, very effectively prevent the attachment dirt particles and water droplets by a defined distribution of micro-roughnesses by water droplets not adhering to the surface but, because of their surface tension, roll across the tips of the roughnesses, absorbing on their path, and taking with them, the dirt which is also attached only to the tips of the roughnesses. This ability enables plants effectively to clean themselves and in doing so to maintain the light absorption necessary for their survival at a high level. This self-cleaning effect can also be on technical surfaces by coating with other materials simulating the roughness of plant leaves. This makes it possible significantly to reduce the otherwise necessary cleaning not only of, for instance, solar cells for maintaining their light absorption, but also of optical surfaces such as facades of buildings and window panes. There are a number of further examples from the animal kingdom such as, for instance, the utilization of the flow and anti-fouling action of whale skin, the direction-dependent generation of friction of snake skin, etc. However, the publication [I, pages 127-130] offers no detailed description of the model formation in the step principle—zero-model—final version (FIG. 67) required for any technical conversion of such analogies.

Publication II (Claus Mattheck, "Design in der Natur—Der Baum als Lehrmeister", Rombach Ökologie, 1997) [II, Pages 13-18, 45-47] relates to the mechanism of biological self-optimization, i.e. the optimization of the use of energy, based upon the example of the adaptive growth of trees. Because of the constant changes of its living conditions during its life-time, the trunk of the tree is subject to various stress conditions as a result of wind, sun, soil composition, etc. By its genetic disposition the tree is enabled to counteract unfavorable distributions of stress by the growth of different thicknesses between positions which are endangered and positions which are not endangered. It always aims at a chronological average at constant stress acting on the entire surface of the trunk of the tree. The same conditions govern other mechanically highly stressed components in nature, such as bones, teeth, claws or talons and the like. The underlying principle, the axiom of constant stress, may be considered to be the basis for biologic-technical construction. Here, too, it is evident that the energy-optimized design of nature, i.e. a component of a weight minimized by elimination of stress-free zones for exerting the force necessary for an intended application, satisfies the model function for ecologically and economically optimized technical structures. The description of the approach for converting ecological designs [II, pages 63, 64], being the closest prior art from which the invention is proceeding, briefly describes the applicable methods and their interaction. The technical object initially provides the relevant basic parameters for the technical design of a structure to be produced. This may, for instance, be the approximate dimensions of a component (limiting measures), effective external loads and the peripheral conditions (fitting, support, guiding). For instance, by the finite-element-method (FEM), mechanics will provide, as numerical tools, stresses, expansions and deformations occurring in the structures. Non-supportive structural areas can then be eliminated by the so-0called soft-kill option (SKO). Thus, a model of a light structure may be made available which may yet suffer from problem zones. These may be subjected to post-treatment with the so-called computer aided optimization (CAO) by further shrinkage and alteration of the structure so that in the end the structure to be designed will result as a lasting lightweight structure by a iterative optimization process. The extent of the optimization process depends directly upon the quality of the prototype. The closer this resembles the complete final structure, the fewer will be the steps leading to optimization. However, overall only relatively simple structures can be converted, and according to the state of the art even the designing of the data-based prototype following a model from nature requires extensive conversion and calculating processes. The only aid in this respect has hitherto been the use of a very simple prototype which, however, only transposes the complex calculations to the final structure since the deviations from the prototype are very large.

Publication III (Hamm, Merkel, Springer, Jurkojs, Maier, Prechtel, Smetacek, "Architecture and material Properties of diatom shells provide effective mechanical protection", Nature, Vol. 421, pages 841-843, February 2003) deals with the specific and variegated structural formation of diatoms as a protection device. The shell structures of unicellular organisms and, especially of bacillariophycea (diatoms, phyto plankton) and phaeodaria (radiolaria, zooplankton) play a decisive modeling role with respect to mechanically stressed light components for structures in mechanical engineering or mechanical esthetic creations in architecture. This field offers a great variety of structures the main purpose of which is to provide protection against mechanical loads and destruction in a functional context with their food competitors and predators while at the same time minimizing their weight, i.e. optimizing the use of energy. About 60,000 types of diatoms of two groups or orders are known which because of their shell geometry are divided into centric (centrales) and pennate (pennales, bow-shaped) ones. The skeleton-like support frames of the diatoms are formed of silicic acid, i.e. the oxy acids of silicon $SiO_2.nH_2O$. Depending upon their water content they are known as ortho-, orthodi- or meta-silicic acid. Without water silicon dioxide or silicic anhydride $SiO_2$ would remain. With a minimum of material diatoms create a maximum of strength and thus have the same purpose as modern light structures.

Publication IV ("Wunderschöne Kieselalgen: Muster für stabile Konstruktionen", Alfred-Wegener-Institut für Polar- und Meeresforschung, Http://www.awi-bremerhaven.de/AWI/Presse/PM/030219 diatomeen-d.html setting forth several technical data relating to diatoms and (Internet) Publication V ("Jugendstil im Meer", Forschungszentrum Jülich, http://fz-juelich.de/portal/index.php?jahr=2203&index=281&cmd=show& mid=125) with photographs relating to the standard test method with glass needles for the mechanical stability of bio-mineralized unicellular organisms.

In conventional designing a drawing is prepared which approximates as closely as possible the technical requirements of the structure to be fabricated. The designed structure is then fabricated, by appropriate fabrication techniques, as a prototype, and tested. If it satisfies the set requirements, i.e. if it withstands loads of a desired range and its service life is adequate without changes impairing its function, it is converted and placed into series or mass production. Otherwise, its critical spots will be reinforced. No weakening is carried out of excessively dimensioned spots since they usually are not known. A progressive construction process will optimize the structure by creating a FEM model, testing it by a computer under required stress conditions and, where indicated, improving it. Even here, however, stresses or tensions are simply reduced by reinforcements. The process does not serve optimization in a general, that is to say ecologico-energetic since; its aim is rather to avoid trial-and-error-steps and thus constitutes optimization only in terms of the time of development. Moreover, in accordance with classical teaching of construction, complete systems are hardly ever optimized from several components. Nevertheless, publications I, II and III leave no doubt that the development of energetically optimized structures and, more particularly, lightweight structures must be to everyone's benefit. Conventional methods attain this goal only by high complexity in terms of calculating time and capacity. It will thus be apparent that the production of a prototype constitutes a decisive step as to an ecological development of structures capable of withstanding high loads. The more closely such a prototype approaches the required conditions the simpler will be to adapt and optimize it for an energetically optimized structure which can be economically produced. At present, a designer can accomplish this at best in any given very narrowly defined special field and only for individual components or very simple systems. However, highly precise prototypes of complicated structures relating to different technical fields cannot be fabricated.

German laid-open patent specification DE 100 53 299 A1 ("Method of designing a component and wiper unit component") discloses, by way of example, an approach for designing mechanical components by computer-aided methods. The method steps include a forming a physical model (model room model), describing the model with its finite elements and using a 3-D program for generating a data model. Furthermore, method steps are disclosed relating to optimizing topology and shape. The example of the application discloses the complexity of obtaining data for a prototype. The methodology of creating a physical model followed by a drawing—nowadays it is oftentimes a data model—or vice versa first a drawing and then, possibly computer-assisted, a physical model, is used in a plurality of variations without providing suggestions for an improved collection of prototype data.

The mentioned publications offer no rational method of creating a suitable prototype by means of which the necessary optimizing work as to a particularly advantageous lightweight structure can be minimized. There is no disclosure of any direct step from the technico-biological study of natural architectures and processes within the ambit of bionically released analogous tests and is thus relegated to a purpose-directed interdisciplinary team of biologists and engineers. In this context, the method to be selected depends upon the subject of the investigation and the technological possibilities of the participants. No presentation is being made of a generalizing methodology which can be adapted to different required profiles.

SUMMARY OF THE INVENTION

In an embodiment, the present invention provides a method of obtaining prototype data for a lightweight technical structure which operates especially efficiently but, nevertheless, reliably. The method provides, effectively in terms of time, prototype data with the aid of which a prototype can be produced which approximates the technical demands placed upon the lightweight structure to be produced.

In the accomplishment of this object, the method in accordance with the invention provides the following steps:

1. Providing the relevant basic parameters of the lightweight technical structure to be produced, in respect of the technical problem;
2. Preselection of one or more bio-mineralized unicellular organisms having shell architectures fitting the provided basic parameters;
3. Selecting one or more fine structures from the range of preselected shell architectures most promising for a technical realization;
4. Direct copying of the structural data from the selected fine structures;
5. Scaling of the copied structural data to the basic parameters of the lightweight technical structure to be produced;
6. Combining and adapting the scaled structural data to a set of prototype data for a prototype for a lightweight technical structure to be produced; and
7. Optimizing the prototype.

To accomplish the object of the invention recourse may be had to the wealth of shapes, functions and processes of nature and its experiences gained by evolution. The shell architectures of mineralized unicellular organisms possess a particularly large pool of variants which are relevant to technology. According to Werner Nachtigall, one of the founders of scientific bionics, nature does not furnish any directly useable models for technological application. Instead, biotechnological studies of natural structures must provide an understanding for the manner in which organisms under observation found solutions and then it apply it to technological problems. The method in accordance with the invention does not question this principle; it merely selects from the many possible organisms a group which is narrowly limited in respect of its basic properties or characteristics and provides a range of examination methodology which is narrowly limited as well and includes their generalized approach. In this manner a pool of models is being provided which while not being immediately accessible can nevertheless be efficiently used by way of the method used in the manner of a recipe. Based upon the knowledge of the demands placed upon the lightweight structure to be created the desired characteristics are initially defined. These are used for pre-selecting suitable bio-mineralized unicellular organisms. The preselection serves to select further sub-groups and individual structural elements with further desirable properties. The structural data thereof are determined directly, the various elements are combined, and an adaptation to peripheral ranges is made. The integrated structure thus generated is scaled to the dimensions called for in accordance with general mechanical principles, thus providing the data for a prototype in a simple manner. Complex calculations of the prototypes are dispensed with and the complexity of calculations in time and space is significantly reduced. A process of optimization subsequently applied takes care of the shaping even unto the desired lightweight structure. The at least semi-automatic collection of structural data on the basis of standardized examination methods is of particular advantage. The use of numerical processes for storing and selecting data sets of bio-mineralized unicellular organisms, their shell architectures and their structural data on the one hand as well as of the data relating to methods of scaling, combining and adapting, of the prototypes and the optimization results thereof on the other hand, are also especially advantageous. Greater details about the method in accordance with the invention and its advantageous improvements may be taken from the specific section of the specification.

DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

DETAILED DESCRIPTION OF THE PREFERRED EMBODIMENTS

Figure 1:
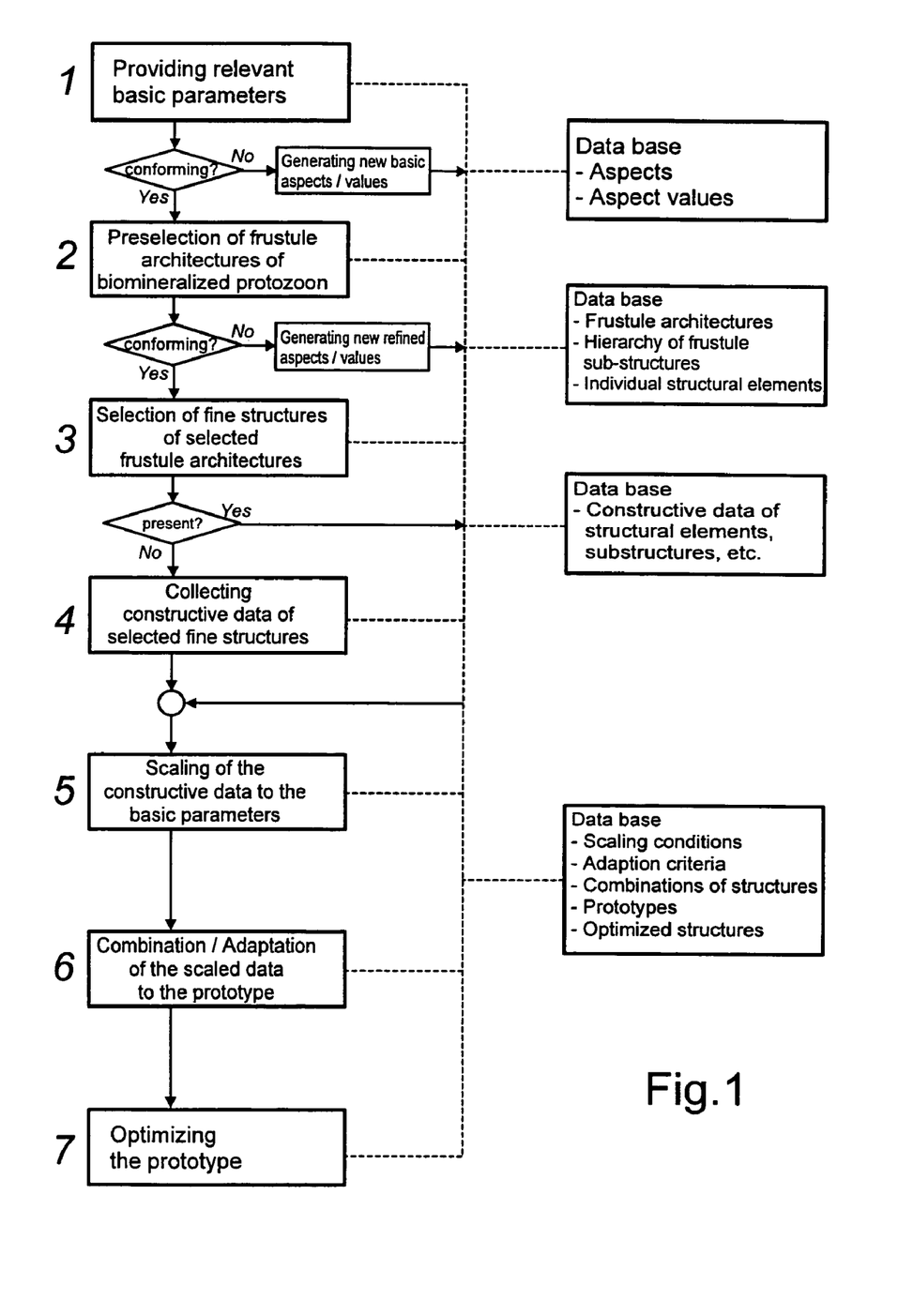
FIG. 1 is a block diagram of the method.

In the method step 1 depicted in the block diagram of FIG. 1, the desired lightweight technical structure is described precisely as to its properties with respect to the technical problem. For this, common descriptive properties of lightweight technical structures and shell architectures of bio-mineralized unicellular organisms may be stored as a basis in a data base as an organized collection of aspects and aspect values. For a description of the properties an aspect catalog indexed by information-technological points of view is used the elements of which may assume well-defined values. The more comprehensively the aspect catalog is laid out and the more successfully the entire observed range of problems can be covered by it, the more precisely can a given technological problem be described. A well maintained aspect catalogue may grow with frequent use and may satisfy ever more precise demands. In the present case of determining prototype data of lightweight structures, the limitations of the space within which the structure may move, the static and dynamic load of the structure, as well as predefined weight relationships of components or esthetic considerations play a significant role.

For solving similar tasks, it may be expected that sub-structures which had been used before can be used again. Data once found for designing a prototype may be used again in an economical way upon presentation of a hierarchy of sub-structures building upon, and combining, each other. In this manner and depending upon the requirements, small or larger sub-structures of higher elevation within the hierarchy may be combined in any desired manner, and the designing of the prototype can be accelerated. Method step 2 permits the extraction of a suitable sub-group by means of a set of aspects filled with suitable values based upon a precise definition of the technical problem of a quantity of fine structures of natural shell architectures sorted in accordance with those criteria. This may advantageously be accomplished by a hierarchy of individual structural elements, larger sub-structures and complete shell architectures of bio-mineralized unicellular organisms stored as an organized collection in a data base. In this method step 2, initially a pre-selection is made with a basic quantify of aspects. If for a desired property no fitting aspect value or even a fitting aspect is available, recourse must be had, for a further step of consideration, to a sub-quantity of natural shell architectures selected in accordance with the remaining criteria. This determines the manner of defining a method of making it possible to enlarge the range of values of an aspect which is present or of a new aspect which describes the determination of the values of the partial problem which has arisen.

By method step 3 the search for suitable fine structures is refined by defining, by a restrictive sub-quantity of aspects or further limitation of the range of values of certain aspects, seemingly particularly suitable shell architectures, sub-structures or structural elements from the quantity of shell architectures which are suitable in principle. Solutions for occurring basic questions of technological mechanics, for instance conditions of stress in problem zones of the desired lightweight technical structures, from the range of the shell architectures of bio-mineralized unicellular organisms can be stored as a catalog of constantly recurring partial solutions by an aspect-related description in a data base. Individual structural elements, larger sub-structures and combinations thereof may be aspected in a hierarchical manner and may also be stored in a data base for future use. By means of the methodology set forth in method steps 1 to 3 the data base makes it possible on the basis of precise and comprehensive aspecting of a problem quickly to arrive at suitable partial solutions. The relevant structural data of the selected partial solutions will then also become available.

In case no sufficiently precise partial solutions can be defined from the records in the data base, standardized methods of examination must in method step 4 be applied to the superordinate structures or, where indicated, complete shell architectures for defining basic mechanical properties. In the most basic case this may require finding and cataloging new bio-mineralized unicellular organisms in nature's store. Alternatively, bio-mineralized unicellular organisms already cataloged would have to be examined for their suitability and structural data. The acquisition of the structural data from the fine structures of the shell architectures is a time-consuming operation. For that reason, the method in accordance with the invention may be carried out advantageously by direct recording of the structural data of the selected fine structures or sub-structures by at least semi-automatic microscopic scanning. The dimensions of the shell structures are in the range of several nanometers for the lowest hierarchical level of sub-structures up to several millimeters for complete shells. For a high-resolution image reproduction several electron-microscopical exposure processes are suitable. For obtaining three-dimensional structural data, several exposures from different perspectives or corresponding spatial exposure systems would be required. If the relations of the exposure angles relative to each other are known, a mathematical program can convert the digitized microscopy images into vectors and thus furnish scalable data for further processing towards the desired prototype formation. One possibility of generating three-dimensional structural models is to use a laser confocal microscope which presents individual layers of microscopic shell architectures. Mathematical programs can recombine them to spatial presentations of the original structures and provide scalable data for the prototype formation. In this connection it is useful to store directly recorded structural data as an organized collection in a data base. The renewed use of the data acquired in this complex manner is obvious since the same or similar sub-structures can be used over and over again for solving repetitive similar problems. Stress tests such as, for instance, the glass needle test (see publications III, IV, V) render indications about the mechanical load rating of the shell architectures.

Method step 5 serves to scale the acquired data to the size conditions of the lightweight technical structure to be fabricated. In the case of static or quasi-static load conditions such a simple projection is permissible. In the case of parts which are used mainly in a strongly dynamic manner the relationships of which cannot be approximated by quasi-static assumptions or direct analogies to shell architectures, different scaling methods may have to be used. In method step 6 all sub-structures are combined to the desired lightweight technical structure, and the junctions are smoothed. The result are the data of a prototype which very closely resembles a spectrum or range of natural models. Here, too, storing criteria for the scaling, the combination and the adaptation of structural data, of prototypes and the results of their optimization as an organized collection in a data base is advantageous.

Lastly, in method step 7 the prototype is optimized to a finished mechanical system. This may be accomplished by different optimizing processes, for instance the SKO and CAO processes presented by publication II.

First Embodiment

Determination of a Prototype for a Lightweight Rim

1. Providing the Basic Parameters of the Lightweight Technical Structure as a Lightweight Rim The required lightweight structure is a wheel consisting of an inner rim disc and an outer rim flange connected therewith, the rim disc being connected to the axle of a vehicle by fasteners and the rim flange being connected to a tire. All the elements together are commonly known as "rim". The rim shown is to consist of a fiber-reinforced polymer of anisotropic material properties.

In the present case of a lightweight rim weight reduction is desired because as an unsprung masses wheel rims should be as light as possible in order to maintain better surface contact and also effectively to adhere to an uneven driving surface. For that reason, the material represents a special challenge since the properties of the material affect the selection of suitable geometries. Since the rim flange and the fastener elements are standardized improvements can be achieved above all in the area of the rim disc. Another requirement to be mentioned for this section is good air permeability for effective cooling of disc brakes.

Figure 2:
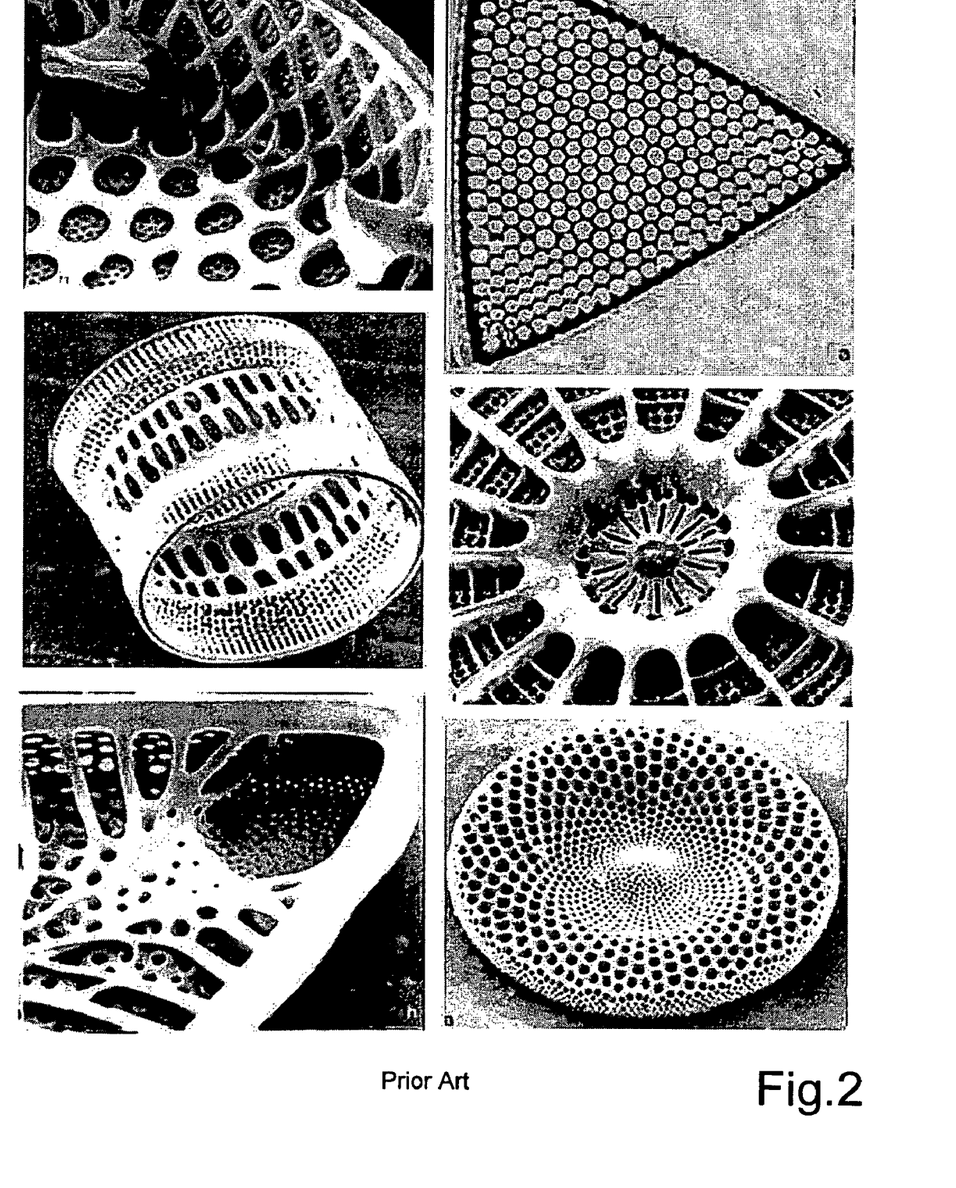
FIG. 2 depicts shell architectures of diatoms.
Figure 3:
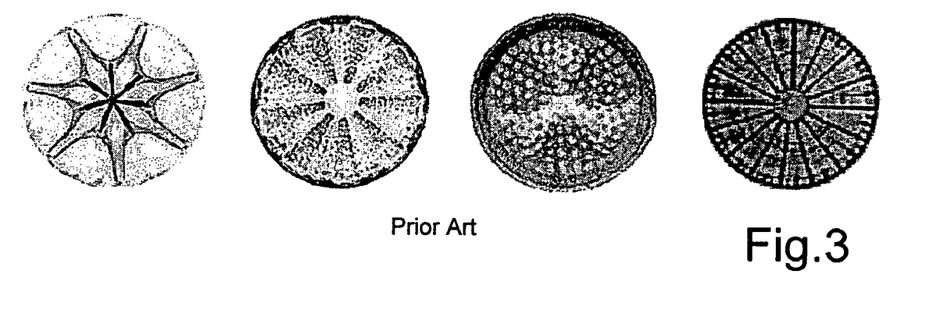
FIG. 3 depicts shell structures of the diatom *asterolampra* (left), *asteromphalus* (twice in the middle) and *arachnoidiscus* (right)

2. Preselection of Bio-Mineralized Unicellular Organisms with Suitable Natural Shell Architectures The group of diatoms is selected from the organisms having biological shall of light construction (especially planktonic bio-mineralized unicellular organisms), since within this group there are present kinds of shell geometries (see FIG. 2) which satisfy the fundamental preconditions for a bionic improvement of a lightweight wheel, i.e. they are relatively flat and wheel-like. Nonetheless, many corresponding genera, such as *thalassiosira, porosira* or *coscinodiscus* are excluded as an approach to solving the present problem, in view of the fact that they have no extractable structural elements. By contrast, those of centric diatoms, such as *asterolampra* (see FIG. 3, left), *asteromphalus* (see FIG. 3, twice in the middle) and *arachnoidiscus* (see FIG. 3, right) are selected each of which contains radially symmetric stiffening structural elements. In nature, diatoms are exposed to different loads which in the multifariousness resemble cases of loads as they also occur at wheel rims. There is also pressure of selection toward light construction because of the limited availability of building material (silicate) and the necessity to produce the structures efficiently (rapidly and with less energy expenditure). The necessity of light construction of the shells is also mandated by the planktonic (floating) way of life of many diatoms. In about 200 million years these diatoms have formed their shells as ultra-light defensive structures by evolutionary processes of adaptation, which has led to highly developed and sometimes very complex lightweight structures. As has been shown by FE calculations, the shells of diatoms consist of an anisotropic material and thus achieve maximum strength at a minimum of material used.

As a rule, the size of diatoms as unicellular organisms is less than a millimeter. The advantage of conversion into the technological field is that the shape of their shells can be scaled, i.e. it can be enlarged true to scale without losing its specific strength since the cross-section of the material and surface load both scale with the square of the longitudinal scale. While their shapes appear to be extraordinary, they are not strange or comical. On the contrary, they are very harmonic and esthetic. Because of their balanced shapes they do not, the novel structuring in rim production notwithstanding, offend viewing habits which in a mass produced item such as a lightweight rim is an essential precondition for acceptance by customers.

Figure 4:
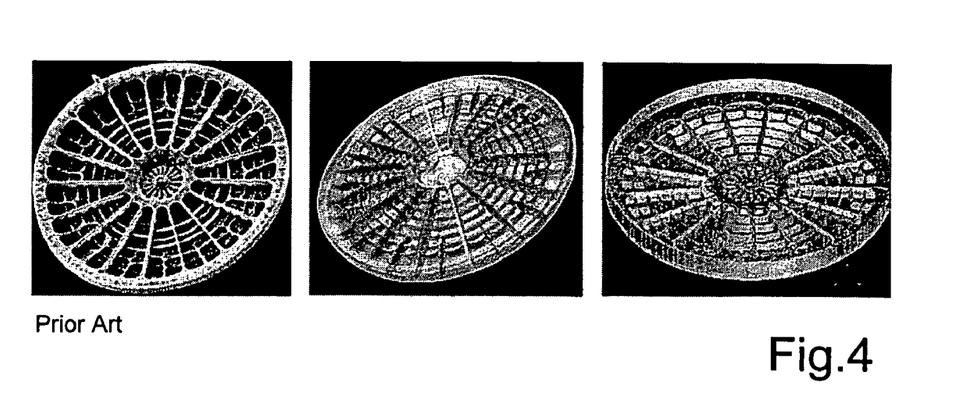
FIG. 4 shows a SEM exposure (left), a CAD model (middle) and a FE model (right) of *arachnoidiscus;*

In spite of interesting suggestions in the shell structures of all of the genera/kinds of diatoms, arachnoidiscus offers a better convertibility than asterolampra since the subsequent production process of a lightweight wheel rim does not allow undercuts of the kind present in asterolampra. The genus asteromphalus is provided with radially undulating shells formed exclusively from a shell penetrated by very fine pores. Owing to the required perviousness of the structure this solution cannot be taken into consideration. With respect to the anisotropic material properties of the fiber-reinforced polymer, the structural elements of arachnoidiscus are advantageous since the stress paths to be expected in such structures essentially conform to fiber orientation produced primarily by the production process (high aspect ratio—width to depth—of the occurring ribs). The potential problem of bending of the very thin spoke-like elements is being compensated by concentric elements disposed at very small distances. FIG. 4 depicts at the left side a SEM exposure of *arachnoidiscus*, a CAD model in the middle, and a FE model at the right. At this stage of the determination process the middle and peripheral ranges of the structures still relate to the structure of a micro alga; moreover, the structure is still closed by pore-like fillings.

Part of the preselection of bio-mineralized unicellular organisms of suitable natural shell architectures in accordance with method step 2 is the performance of micro-mechanical tests for detecting mechanical properties. Micro-mechanical tests have been exemplarily performed with centric diatoms (*thalassiosira* and *coscinodiscus*). By these tests in which the shell of diatoms was subjected to increasing pressure until destruction by a glass needle it was possible to prove generally favorable properties of shells of diatoms. A breaking force of, for instance, 300 μN in *thalassiosira* of a size between 30 μm and 130 μm corresponds to a load range of several hundred tons in a lightweight structure scaled up to one square meter.

3. Selection of Fine Structures of the Most Promising Ranges of the Preselected Shell Architectures From the entire structure of *arachnoidiscus* the internal structures in the valves but not in the loculate areoles (honeycomb structures with extremely small pores) are selected since for effectively cooling the brake discs it is necessary to provide an effective exchange of air between the inwardly and outwardly facing surfaces of the rim disc. In *arachnoidiscus* the frame-like inner structure consists of radial and concentric structural elements the aspect ratio of which (width to depth of a rib) is extraordinarily high.

4. Direct Copying of Structural Data from the Selected Fine Structures

The structural data of the shell structure are obtained directly from light and scanning electron microscopic exposures and are converted into three-dimensional model by means of CAD and FE programs.

5. Scaling of the Copied Data to the Basic Parameters of the Lightweight Rim

Scaling is performed essentially on the basis of the original model (*arachnoidiscus*) with only a few simplifications as desirable for production such as the elimination of undercuts and the presentation of the structure as being perfectly radially symmetric.

6. Combination and Adaptation of the Scaled Data to a Set of Prototypes for a Lightweight Rim The radial and concentric structural elements are combined with the standardized areas of the wheel mount as well as the outer rim (bead at the front side of the rim) and the rim itself, and smoothed. The resultant prototype is dimensioned such that permits calculations for direct comparison with an actual lightweight rim of known properties. Also, as an auxiliary aspect, the design of the prototype produced in accordance with the method here described is evaluated by stereo-lithographically producing and optimizing a 1:1 prototype for the lightweight rim. Different views of the finished prototype for a lightweight rim of integrated lightweight geometry based upon the topology of *arachnoidiscus* will be described infra.

7. Optimization of the Prototype for a Lightweight Rim

Thereafter, the specific load conditions relevant for lightweight rims are applied with the aid of predetermined load programs in order to carry out a final adaptation of the prototype to the required performance characteristics of a lightweight rim by means of FE programs and optimization software.

Concrete Embodiments of the Prototype for a Lightweight Rim

A prototype for a lightweight rim can efficiently be developed by the previously described method on the basis of the actual image of *arachnoidiscus*. A lightweight rim for an automotive vehicle consists of an inner rim disc for mounting on an axle and a peripheral rim bed connected to the rim disc. In special embodiments the rim disc may be formed as a structure of supporting spokes.

The lightweight rim prototype developed by the described method is characterized by a highly symmetric and special filigreed structure which make possible the use of little material, yet guarantees, because of its high degree of cross-linking, high strength, particularly as regards collapse of the spokes. In the structure of the spokes, a distinction is made between radial and annular spokes. The spokes are formed in the manner of ribs so that, looking at the front side of the prototype, they take up only small space and subsequently make possible an optimal ventilation of the disc brakes positioned behind the lightweight rim made on the basis of the prototype. The radial spokes have a high aspect ratio in the width of the ribs relative to their depth. The shape of the rib is narrow, yet deep or high, which results in the one aspect of its strength. The second aspect of strength is the result of the crossing superposition of the radial spokes over the annular spokes such that all the spokes support each other. Depending upon the number of spokes, the result is a highly symmetrical overall image of the prototype similar to a checkered paper with a mesh image determinable by the selected geometry of the ribs. The mesh image is also and in particular characterized by not all spokes extending to the axis of the rim. Rather, from the rim bed, some of the radial spokes extend over one third only of the rim disc. They all terminate at one of the outer annular spokes. This measure which pertains to symmetrically arranged radial spokes, for instance every third radial spoke, later during production of the lightweight rim yields a further reduction of the weight of the rim without the lightweight rim sacrificing any of its strength. The appearance of the spoke structure is an opened one without leading to restlessness.

The structure of the spokes may be completely symmetrical if the radial and annular spokes are structured equally. One embodiment of the prototype may, however, also be characterized by a lower aspect ratio of the annular spokes relative to the aspect ratio of the radial spokes with the annular spokes in the front surface extending flush or almost flush with the radial spokes. This results in a spoke structure dominated by gaps and of especially high radial strength, particularly in respect of collapse of the radial spokes, but which is nevertheless sufficiently supported orbitally. The optical overall impression is not detrimentally affected by the flatter annular spokes being disposed at the front side of the rim disc such that they extend flush or almost flush with respect to the radial spokes rather than being displaced towards the rear. The prototype for a lightweight rim developed directly from the actual image of *arachnoidiscus* may be characterized by sixteen radial spokes and six annular spokes with every second radial spoke extending from the rim bed to the second annular spoke only. This is a structural arrangement which by theoretical and practical tests has led to a particularly advantageous embodiment of a lightweight rim.

Further modifications of the prototype may be characterized by rounding off the bridging member between radial spokes at the rim bed and by a concentric circular disc in the area of the wheel nave of the rim body into which the radial spokes extend. Such modifications serve further to improve the strength and may be determined by load simulating programs. They also improve visual appearance and handling of the lightweight rim made on the basis of the prototype. Rounding off the spaces between the spokes will facilitate cleaning at a later time and the concentric circular disc ensures improved mounting.

Figure 5:
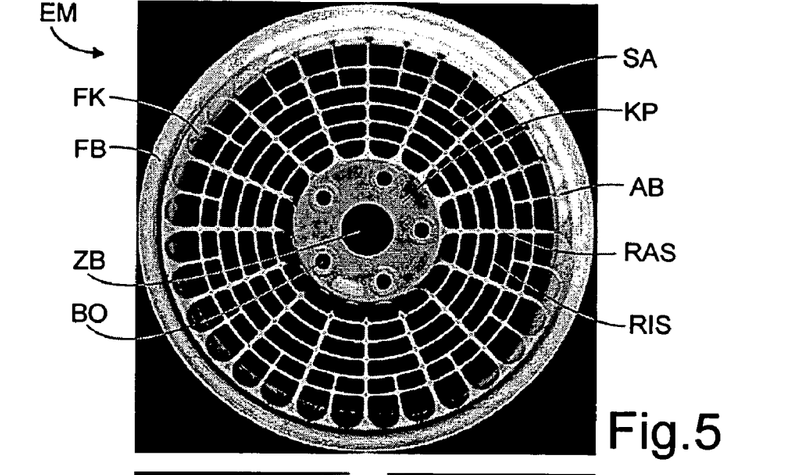
FIG. 5 shows a frontal view of a prototype for a lightweight rim with a cut-out.

FIG. 5 depicts a prototype EM of a lightweight wheel rim for an automotive vehicle with an inner rim body FK and an outer rim bed FB connected thereto. In the case of an actual lightweight rim a tire can be mounted on the rim bed FB. The rim body FK is provided with a central bore ZB to receive an axle shaft and is fastened to it by several wheel bolts seated in bores BO provided therefor. The rim body FK is provided with a supporting spoke structure SA. The spoke structure SA is formed highly symmetrically and consists of a plurality of radial spokes RAS and annular spokes RIS. The spokes of either type are shaped as rectangular ribs and are relatively narrow yet long and deep. The rib-like radial spokes RAS have a particularly high aspect ratio. They are formed to be very narrow and are of a depth such that for future operation sufficient strength and stability of the lightweight rim can be attained. The depth of the radial spokes RAS may for instance be in the range of one sixth of the width of the rim bed FB. The radial spokes RAS are crossed by a plurality of concentric annular spokes RIS. These are circumferentially close and arranged at a constant radial distance from each other. In the embodiment shown, sixteen radial spokes RAS are crossed by 6 annular spokes. The result is a small-meshed grid of high stability. The ring spokes have a lower aspect ratio than the radial spokes RAS and serve mainly to stiffen them. In order to create a homogeneous image as seen from the front face of the prototype EM the annular spokes RIS are disposed at the front surface of the rim bed FB and are flush with the radial spokes RAS.

The main load is borne by the radial spokes RAS. However, this does not require that all radial spokes RAS extend to the central bore ZB. Maximum stiffening in the area of the rim bed FB is sufficient. For that reason every other radial spoke RAS extends from the rim bed FB only up the second annular spoke RIS. This contributes to the very symmetric appearance of the ring of the rim which is further improved by roundings AB between radial spokes RAS towards the rim bed FB. Furthermore, in the section for mounting the rim body FK to the axle, there is provided a concentric circular disc KP into which the radial spokes RAD extend and which harmonically completes the grid pattern. The concentric circular disc KP is provided with bores BO for receiving wheel bolts and ensures a high stability of the loaded axial section of the lightweight rim LF.

Figure 6:
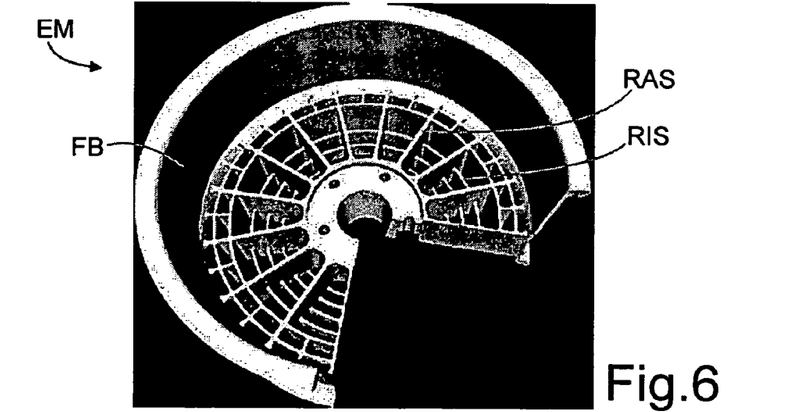
FIG. 6 is a rear view of the prototype with a cut out.
Figure 7:
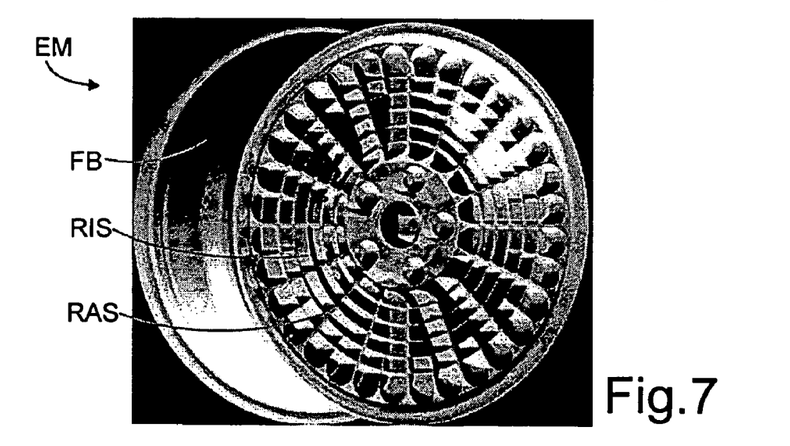
FIG. 7 shows the prototype in perspective side view with a cut-out.

FIGS. 6 and 7 are perspective rear views each with a cut-out section of the embodiment of the prototype EM according to FIG. 5. The reference characters correspond to those of FIG. 5. In FIG. 6 is can be seen that the radial spokes RAS and the annular spokes RIS are arranged only at the front face of the rim bed FB. The higher aspect ration of the radial spokes RAS relative to that of the annular spokes RIS can also be seen. The sturdy formation of the rim bed FB and the rib-like formation of the annular spokes RIS can be seen clearly in FIG. 8.

Second Embodiment

Determination of a Prototype for a Light Building Material

1. Preparation of the Basic Parameters of the Light Technical Structure as a Light Building Material The required light building material is a completely or substantially completely closed shell which is to have a high degree of flexibility as well as a good memory of shape. Where necessary, these properties must be combined with a predetermined permeability. Such structures can be used in many ways in the automotive industry as well as in air travel and space travel. The geometry is to be realized by production processes which are conventional or which can easily be developed. In particular, in the present example novel methods of light construction such as the production of metal foams and hollow spheres are to be applied.

Figure 8:
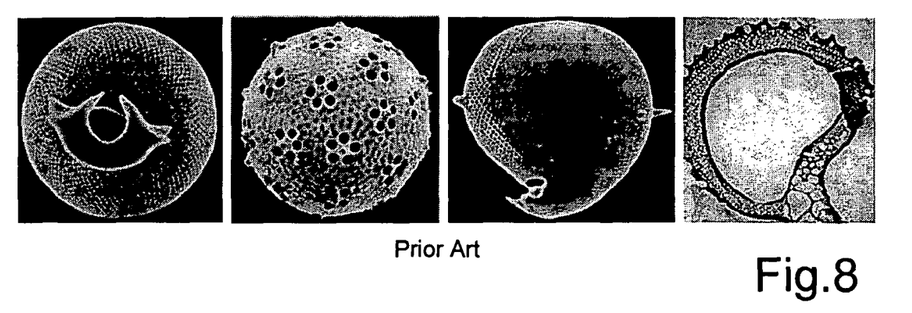
FIG. 8 depicts shell structures of phaeodaia (not useful)

2. Preselection of Bio-Mineralized Unicellular Organisms with Appropriate Natural Shell Architectures From those organisms with biological shells of light structure (especially planktonic bio-mineralized unicellular organisms) the group of radiolaria and, more particularly the sub-group of phaeodaria is selected since within this genus there are present type of shell geometries which satisfy the fundamental preconditions for a bionic improvement of this light structure. Unicellular organisms such as diatoms or the nasselaria which also belong to the radiolaria, cannot be used for finding a solution to the present problem since they have a very open architecture. FIG. 8 depicts scanning and transmission electron microscope exposures of different substantially closed shells of phaeodaria which are not suitable for designing a light building material.

Figure 9:
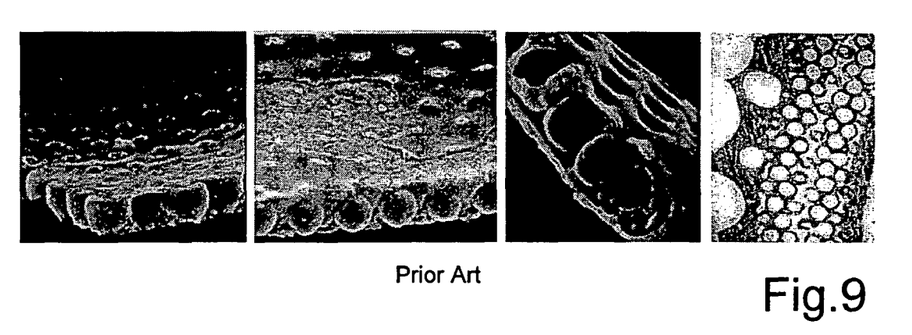
FIG. 9 depicts shell structures of phaeodaria (useful)

By contrast, genera such as *challengeron* are identified as especially suitable geometries since they posses closed shells as well as shells with very small pores. The criteria posed from the point of view of production—the use of existing production processes—can be met by a combination of hollow bodies and foam between solid cover layers. FIG. 9 shows a selection of shell structures which fall under the principle of "hollow spheres and foam between solid layers". Noticeably, the hollow spheres are mostly anchored with specific structures in the solid outer shell. Interesting suggestions in the structures of other structures of different groups of organisms for solving problems notwithstanding, they usually are not as suitable for the present problem. While many biological exoskeletons are armed with spine-like extensions and thus supplement their purely defensive protective function, this is not usually desirable in technical components. Phaeodaria, by contrast, are provided with a substantially smooth shell which, as is also desirable in connection with automotive body components, offers a passive defensive type of protection. The structure of the phaeodaria is of interest also because of a possible permeability which for an identical mechanical strength in conventional structures often requires a substantial mechanical reinforcement in order to prevent possibly resulting weak points. Various geometries realized in phaeodaria are designed to prevent tension peaks in these areas.

Micro-mechanical tests ("needle test"—see supra) were carried out with antarctic phaeodaria (*challengeron*). It was already possible by these tests to prove generally favorable mechanical properties of the shells of unicellular organisms. Specifically, the tests indicated a significant degree of flexibility and pseudo-elasticity and memory of shape. Since in all probability these characteristics are cause not by the properties of the material (silicate) alone but primarily by the specific construction in the µm range, it is probable to transfer the structural principles to technical shell made of other materials.

Figure 10:
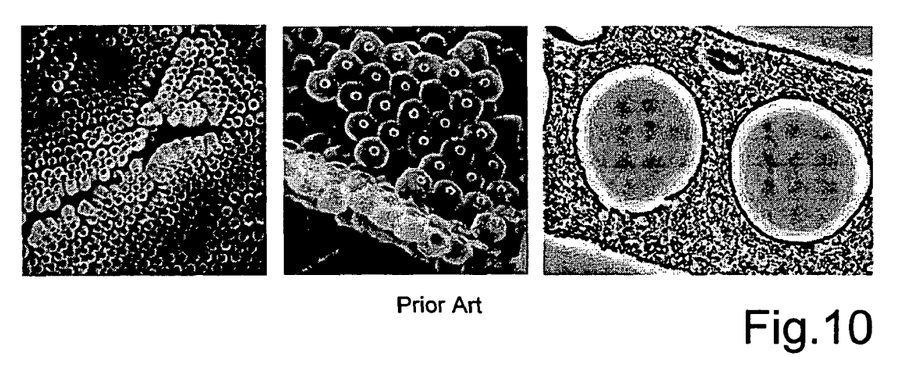
FIG. 10 depicts details of the inner structure of shells of phaeodaria.

3. Selection of Fine Structure of the Most Promising range of the Preselected Shell Architectures The internal structures are more exactly analyzed from the overall structure of the phaeodaria. Noticeably, that greater strength is attained by preferred directions of the elements of the foam-like material disposed between the hollow spheres than is the case with purely isotropic foams (see FIG. 9). FIG. 10 depicts details of the internal structure of the shells of phaeodaria. At the left and at the center of FIG. 10 depict bitten shells which show that no rigid connections exist between individual hollow elements. The entire absence of a foam matrix indicates clear material-specific differences between foam and hollow elements. In addition, reinforcements may be seen around the pores on the outer side of the hollow elements. The right part of FIG. 10 displays a TEM section. The presence of the hollow spheres does not cause any topological anisotropy in the foam matrix.

4. Direct Copying of the Structural Data from the Selected Fine Structures

Figure 11:
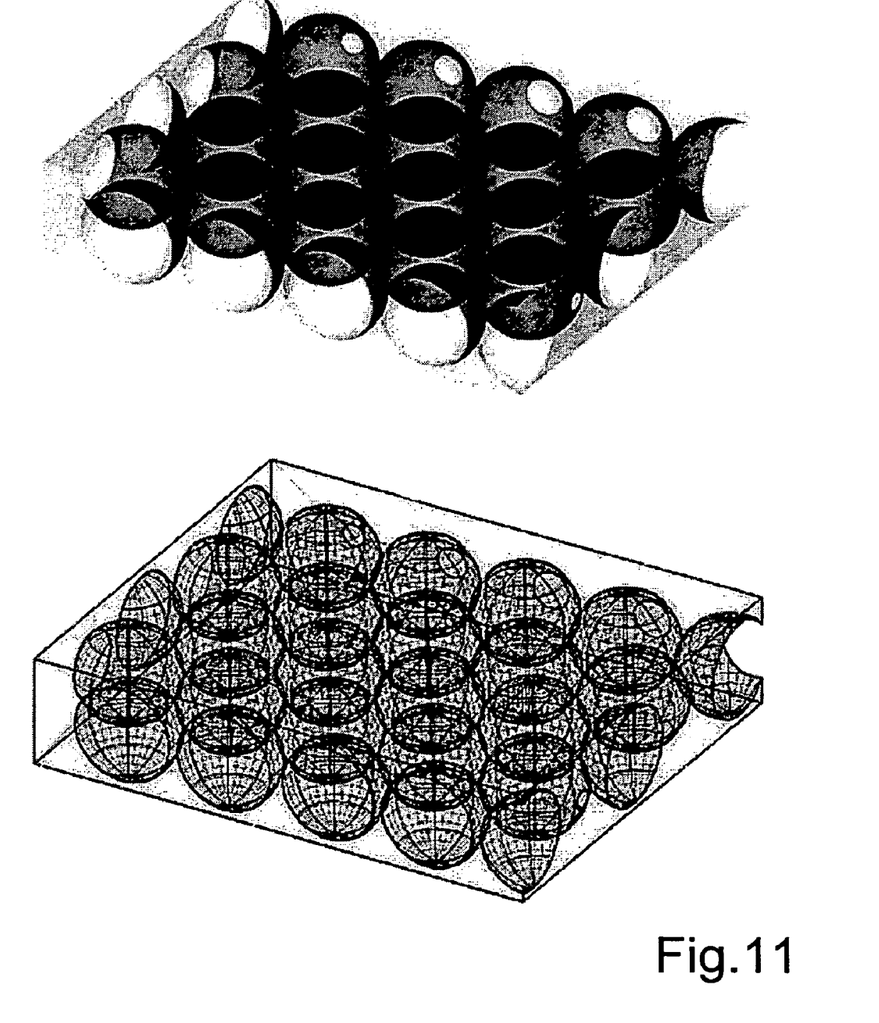
FIG. 11 depicts a prototype for a lightweight building material as a surface model (left) and as a line model (right)

The data are obtained directly from light and scanning electron microscopic exposures and converted to three-dimensional models with the aid of CAD and FE programs. At the left, FIG. 11 depicts in a matrix as a surface and line image a first prototype in the initial shape of hollow spheres. Proceeding from this three-dimensional model different variants are developed and tested for different physical characteristics by means of FE analyses.

5. Scaling of the Copied Data to the Basic Parameters of the Light Building Material In essence scaling is carried out on the basis of the original model which for shells is possible because of the specific laws of similarity.

6. Preparation of the Scales Data to a Set of Prototype Data for a Light Building Material The preparation follows the technical production possibilities for producing prototypes and, where applicable, a production process suitable for serial production.

7. Optimization of the Prototype

Thereafter the specific load conditions relevant to light building materials are applied by means of predetermined load programs in order to execute a final adaptation of the prototype to the required performance characteristics of a light building material.

Third Embodiment

Determining a Prototype for a Permeable Light Structure Shell

1. Preparation of the Basic Parameters of the Technical Light Structure to be Produced as a Permeable Light Structure Shell The required light structure is a very light gas-pervious shell which is strong locally as well as overall. In the present case the shell is specifically designed for computer housings. A basic profile required for computer housings, for lap tops in particular, consists of a combination of high strength, low weight, low noise development and high air permeability to ensure sufficient cooling. Because of the increase of the pulse frequency in particular of new processors and graphic chips and of the energy conversion it entails, the heat generation of the computers is becoming a general problem. The requirement for these characteristics is particularly extreme in connection with lap tops the pulse frequency of which is controlled because of hazardous over-heating, since the application of ventilation systems is strongly limited because of their inherent high energy need or because their significantly increased noise level. The geometry is to be realized production processes which are either continuous or which can easily be implemented. In the present example novel processes of light construction, similar to those of the use of hollow spheres, are to be applied.

Figure 12:
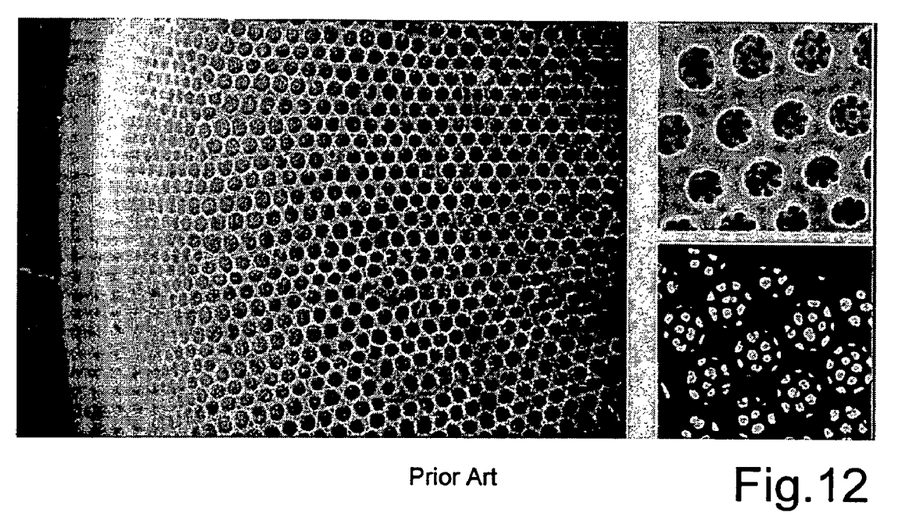
FIG. 12 depicts details of the inner structure of the shells of *coscinodiscus wailesii*.

2. Preselection of Bio-Mineralized Unicellular Organisms with Suitable Natural Shell Architectures The group of diatoms, more particularly those with socalled "locutal aeroles" (honeycomb-like shell structures of often fractal pore structure), were selected from organisms with bio-mineralized light structure shells (especially planktonic bio-mineralized unicellular organisms). FIG. 12 depicts scanning and transmission electron microscopical images of the fractally built-up pores of *coscinodiscus wailesii* having pore size of 800 nm, 15 nm and 30 nm. Because of the specific selection pressure, the shells of diatoms must satisfy exactly the demands for stability and low weight as well as permeability, with the exchange of nutrients and metabolic products taking precedent over the exchange of heat but operating on the same principle. The smallest pores at the exterior surface of the shell often cannot be seen even with a scanning electron microscope, i.e. they are extremely small, without allowing a significant increase of the diffusion resistance.

The most suitable geometries identified were those of genera such as *coscinodiscus* since their shell have very small, uniform and in terms of their size hardly variable pores. The application of a pore structure hierarchically divided in accordance with a biological model on the entire surface of a computer housing (optionally including the key board) can ensure an effective heat exchange. The criteria postulated from the point of view of production processes—the application of existing production processes—may be met by a combination of hollow bodies of different sizes.

Micro-mechanical tests ("needle test", see supra) were performed with centric diatoms (*coscinodiscus* and *thalassiosira*). By these tests, it was possible to prove generally favorable mechanical properties of the shells; the tests more particularly provided a indications of a high degree of stiffness. Since this property is the result of the specific structure in the µm range, it is possible to transfer the structural principles to technical shells from other materials.

3. Selection of Fine Structures of the Most Promising Domain of the Preselected Shell Architectures Of the overall structure of the diatoms only the pores were more accurately analyzed, but not their arrangement which is determined by the circular overall surface of the valve. The marginal portions and diverse extensions (rimoportulae, fultoportulae) of the shell were also not included in the selection.

4. Direct Copying of the Structural; Data of the Selected Fine Structures

The data were gathered from light and scanning electron microscopical exposures and converted into three-dimensional models (idealized standard pore) by means of CAD and FE programs. Proceeding from this three-dimensional model, different variants are developed and tested for various physical characteristics by means of FE analyses.

5. Scaling of the Copied Data to the Basic Parameters of the Permeable Lightweight Structure Scaling is essentially carried out on the basis of the original model which for shells is possible because of the specific laws of similarity.

Figure 13:
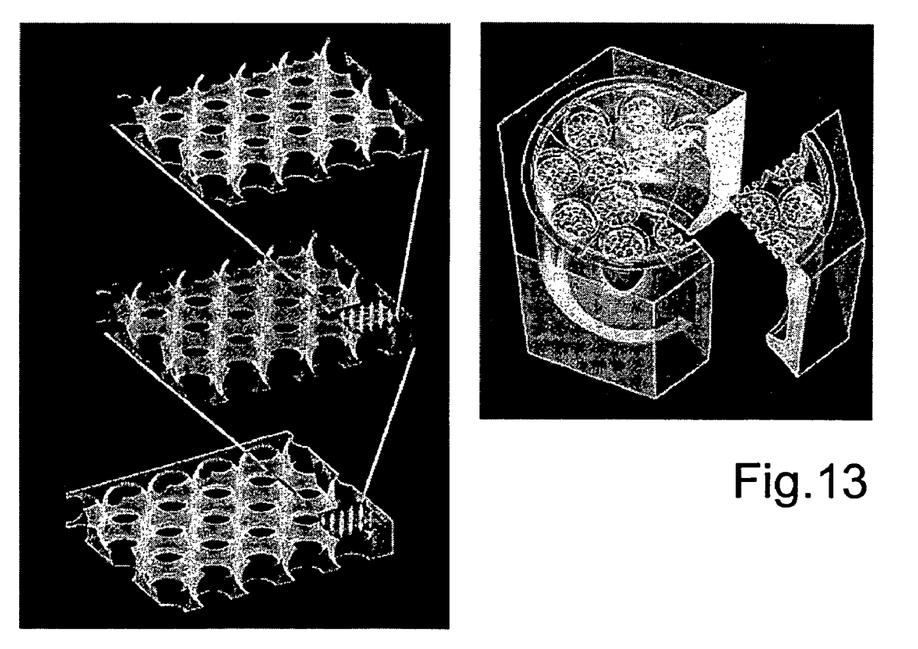
FIG. 13 depicts a prototype for a permeable lightweight shell as a fractal layer model (left) and in section (right).

6. Preparation of the Scaled Data to a Set of data for the Prototype for a Permeable Lightweight Shell The preparation is carried out with reference to the technical production possibilities for producing prototypes and, where required, a production process suitable for serial production. At the left of FIG. 13 there is shown a fractal layer model for a realizable structure which in a first approximation represents three layers of hollow spheres in a matrix. The maximum diameters of the cavities are of a ratio of 125:5:1, e.g. 1 cm. 2 mm and 400 µm. At the right of FIG. 13 there is shown a model of a section of a smallest pore. It displays the downwardly open cavities and the smaller cavities of membrane function disposed at the top.

7. Optimization of the Prototype

Currently static and permeability of the structure in particular are being examined by means of FE calculations in order, where indicated, further to optimize the required performance characteristics.

The invention claimed is:

1. A method of determining the structural data of a prototype for a lightweight technical structure, comprising the method steps:
   a. preparing relevant basic parameters of the technical lightweight structure to be produced with respect to the technical problem;
   b. preselecting one or more bio-mineralized unicellular organisms with natural shell architectures suitable for the prepared parameters;
   c. selecting one or more fine structures of the preselected shell architectures most promising for a technical realization;
   d. directly copying the structural data from the selected fine structures;
   e. scaling the copied structural data to the basic parameters of the lightweight technical structure to be produced;
   f. combining and adapting the scaled structural data to a set of prototype data for a prototype for the lightweight technical structure to be produced; and
   g. optimizing the prototype using a processor operating with optimization software.

2. The method of claim 1 including storing common descriptive properties of lightweight technical structures and shell architectures of bio-mineralized unicellular organisms as an organized collection of aspects and aspect values in a data base.

3. The method of claim 2 including storing a hierarchy of individual structural elements, greater subgroups and complete shell architectures of bio-mineralized unicellular organisms characterized by their known properties as an organized collection in a data base.

4. The method of claim 3 including direct copying of the structural data of the selected fine structures or substructures by at least semi-automatic scanning with a microscope.

5. The method of claim 4, including storing of the directly copies structural data as an organized collection in a data base.

6. The method of claim 5, including storing criteria for the scaling, the combining and the adapting of the structural data, of prototypes and their optimization results as an organized collection in a data base.

7. The method of claim 1, wherein one of *arachnoidiscus* and *coscinodiscus* from the genera of diatoms is preselected as bio-mineralized unicellular organisms.

8. The method of claim 1, wherein phaeodaria from the genera of radiolaria are preselected as bio-mineralized unicellular organisms.

9. The method of claim 1, wherein the structural data is provided by a scanning microscope.

10. The method of claim 1, wherein the directly copying includes converting the structural data into a three-dimensional model using at least one of a computer aided design (CAD) program and a finite element (FE) program.

11. The method of claim 1, wherein the optimization software includes an FE program.

12. The method of claim 1, further comprising the step of:
   h. manufacturing the prototype of the lightweight structure.

* * * * *